United States Patent
Doi et al.

(10) Patent No.: US 10,495,327 B2
(45) Date of Patent: Dec. 3, 2019

(54) INVERTER APPARATUS

(71) Applicant: DAIKIN INDUSTRIES, LTD., Osaka (JP)

(72) Inventors: Hirotaka Doi, Osaka (JP); Hiroshi Doumae, Osaka (JP); Nobuyasu Hiraoka, Osaka (JP); Sumio Kagimura, Osaka (JP); Keito Kotera, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/740,700

(22) PCT Filed: Jun. 6, 2016

(86) PCT No.: PCT/JP2016/066757
§ 371 (c)(1),
(2) Date: Dec. 28, 2017

(87) PCT Pub. No.: WO2017/013951
PCT Pub. Date: Jan. 26, 2017

(65) Prior Publication Data
US 2018/0187905 A1 Jul. 5, 2018

(30) Foreign Application Priority Data
Jul. 21, 2015 (JP) .................... 2015-143853

(51) Int. Cl.
*F24F 1/24* (2011.01)
*H05K 1/02* (2006.01)
(Continued)

(52) U.S. Cl.
CPC ............. *F24F 1/24* (2013.01); *F25D 23/003* (2013.01); *F25D 31/00* (2013.01); *H02M 7/003* (2013.01);
(Continued)

(58) Field of Classification Search
CPC ....... F24F 1/24; H05K 7/2089; H05K 1/0203; H01L 23/427; H01L 23/4275;
(Continued)

(56) References Cited

U.S. PATENT DOCUMENTS 5,373,418 A * 12/1994 Hayasi ............... H01L 23/4006
361/809
6,060,859 A 5/2000 Jonokuchi
(Continued)

FOREIGN PATENT DOCUMENTS

| JP | H11-113283 A | 4/1999 |
|---|---|---|
| JP | 2002-204580 A | 7/2002 |

(Continued)

OTHER PUBLICATIONS

International Search Report issued in PCT/JP2016/066757 dated Jul. 19, 2016, with translation (5 pages).
(Continued)

*Primary Examiner* — Roshn K Varghese
(74) *Attorney, Agent, or Firm* — Osha Liang LLP

(57) ABSTRACT

An inverter apparatus variably controls an operation frequency of an electric motor provided in a refrigerating device, and includes: a printed wiring board; a power device attached to one surface of the printed wiring board, the power device including a converter circuit and an inverter circuit; a reactor arranged on a side of the one surface of the printed wiring board, at least a part of the reactor being arranged within a plane projection area of the printed wiring board; and a cooler for cooling the power device and the reactor, the cooler being arranged such that the power device and the reactor are interposed between the cooler and the printed wiring board.

4 Claims, 8 Drawing Sheets

(51) Int. Cl.
  *H01L 21/473* (2006.01)
  *H02M 7/48* (2007.01)
  *F25D 23/00* (2006.01)
  *F25D 31/00* (2006.01)
  *H02P 27/04* (2016.01)
  *H02M 7/00* (2006.01)
  *H01L 23/473* (2006.01)
  *H05K 7/20* (2006.01)

(52) U.S. Cl.
  CPC ............ *H02M 7/48* (2013.01); *H02P 27/04* (2013.01); *H05K 1/0203* (2013.01); *H01L 23/473* (2013.01); *H05K 7/2089* (2013.01)

(58) Field of Classification Search
  CPC .............. H01L 23/433; H01L 23/4332; H01L 23/4334; H01L 23/4336; H01L 23/4338; H01L 23/44; H01L 23/445; H01L 23/46; H01L 23/467; H01L 23/473
  See application file for complete search history.

(56) References Cited

U.S. PATENT DOCUMENTS

| | | | |
|---|---|---|---|
| 6,650,559 B1 | 11/2003 | Okamoto et al. | |
| 2004/0232876 A1* | 11/2004 | Matsushiro | H02P 27/045 318/801 |
| 2006/0044848 A1* | 3/2006 | Suzuki | H02M 5/4585 363/37 |
| 2006/0232942 A1* | 10/2006 | Nakatsu | B60L 11/08 361/710 |
| 2008/0266811 A1* | 10/2008 | Yamada | F24F 1/12 361/720 |
| 2013/0194853 A1* | 8/2013 | Tokuyama | H01L 23/36 363/131 |
| 2015/0048675 A1* | 2/2015 | Fujii | H05K 9/0037 307/10.1 |
| 2015/0128631 A1 | 5/2015 | Oguri et al. | |

FOREIGN PATENT DOCUMENTS

| | | |
|---|---|---|
| JP | 2007-312502 A | 11/2007 |
| JP | 2012-70531 A | 4/2012 |
| JP | 2012-170183 A | 9/2012 |
| JP | 2012-210002 A | 10/2012 |
| JP | 2013-224785 A | 10/2013 |

OTHER PUBLICATIONS

International Preliminary Report on Patentability issued in corresponding International Application No. PCT/JP2016/066757 dated Feb. 1, 2018 (7 pages).

Extended European Search Report issued in corresponding European Patent Application No. 16827515.4 dated Feb. 15, 2019 (7 pages).

* cited by examiner

INVERTER APPARATUS

BACKGROUND

Technical Field

One or more embodiments of the present invention relate to an inverter apparatus that controls an electric motor provided in a refrigerating device.

Background Art

As a refrigerating device of an air conditioner or the like that adjusts a temperature and a humidity of the room interior, there is a refrigerating device that controls an electric motor for a compressor and a fan by an inverter apparatus. For example, an inverter apparatus described in Patent Literature 1 includes a power device including a converter circuit and an inverter circuit, and a reactor provided in a DC power supply wire between the converter circuit and the inverter circuit to suppress harmonic. The power device is mounted on a printed wiring board, and the reactor is arranged at a position separated from the printed wiring board and connected to the printed wiring board by a harness (electric wire). The power device on the printed wiring board is cooled by a cooling jacket to which a refrigerant pipe is connected.

Patent Literature 1: Japanese Unexamined Patent Publication No. 2013-224785

In the inverter apparatus described in Patent Literature 1, the reactor is arranged at the position separated from the printed wiring board when seen in a plan view. Thus, there is a need for a large space for arranging these. Therefore, size of an electric component box that houses the printed wiring board and the reactor is also increased, and restriction upon arranging the electric component box in the air conditioner is increased.

The reactor is a so-called strong electric part, and a large electric current flows through the harness connecting the reactor and the printed wiring board. Therefore, a possibility that the harness serves as a noise propagation route and provides a harmful influence on peripheral electric parts (such as weak electric parts connected to the printed wiring board) is increased.

Meanwhile, in the inverter apparatus described in Patent Literature 1, the power device which is a heat generating part is cooled by the cooling jacket. However, cooling of the reactor which is similarly a heat generating part is not considered at all.

SUMMARY

One or more embodiments of the present invention provide an inverter apparatus which can be more downsized, where an electric wire connecting a reactor and a printed wiring board can be shortened as far as possible, and the reactor can also be cooled.

One or more embodiments are directed to an inverter apparatus that variably controls an operation frequency of an electric motor provided in a refrigerating device, including a printed wiring board, a power device attached to one surface of the printed wiring board, the power device including a converter circuit and an inverter circuit, a reactor arranged on a side of the one surface of the printed wiring board, at least a part of the reactor being arranged within a plane projection area of the printed wiring board, and a cooler for cooling the power device and the reactor, the cooler being arranged such that the power device and the reactor are interposed between the cooler and the printed wiring board.

With one or more embodiments of the above configuration, at least part of the reactor is arranged within the plane projection area of the printed wiring board. Thus, the inverter apparatus can be more downsized, and an electric wire connecting the reactor and the printed wiring board can be eliminated or shortened. Therefore, an influence of noises provided to peripheral electric parts by the electric wire can be reduced. The power device and the reactor can be arranged as close to each other as possible. Thus, not only the power device but also the reactor can be cooled by using the cooler.

In one or more embodiments of the above configuration, the entire reactor is arranged within the plane projection area of the printed wiring board.

With such a configuration, the inverter apparatus can be furthermore downsized.

According to one or more embodiments, a connection terminal of the reactor is arranged within the plane projection area of the printed wiring board and directly connected to the printed wiring board.

With this configuration, the electric wire which connects the reactor and the printed wiring board, and serves as a noise propagation route can be eliminated.

According to one or more embodiments, a connection terminal of the reactor may be arranged out of the plane projection area of the printed wiring board and connected to the printed wiring board via an electric wire.

With this configuration, the connection terminal of the reactor is arranged out of the plane projection area of the printed wiring board. Thus, a task for connecting the electric wire to the connection terminal such as arrangement of the electric wire can be easily performed.

According to one or more embodiments, the reactor is a harmonic suppression reactor provided between the converter circuit and the inverter circuit in an electric circuit, the printed wiring board includes a first connection portion to which the power device is connected, a second connection portion to which the reactor is connected, a third connection portion to which a power supply wire is connected, and a fourth connection portion to which an output wire to the electric motor is connected, and the first connection portion is arranged between the second connection portion, and the third connection portion and the fourth connection portion.

In the inverter apparatus according to one or more embodiments, an electric current from a power supply flows to the converter circuit, the reactor, and the inverter circuit in this order, and is outputted to the electric motor. Therefore, by arranging the connection portions as in the above configuration, wiring patterns in the printed wiring board can be formed along a flow of the electric current, so that the wiring patterns can be simplified.

One or more embodiments provide the inverter apparatus which can be more downsized, where the electric wire connecting the reactor and the printed wiring board can be shortened as far as possible, and the reactor can also be cooled.

DETAILED DESCRIPTION

Hereinafter, embodiments of the present invention will be described with reference to the drawings.

Figure 1:
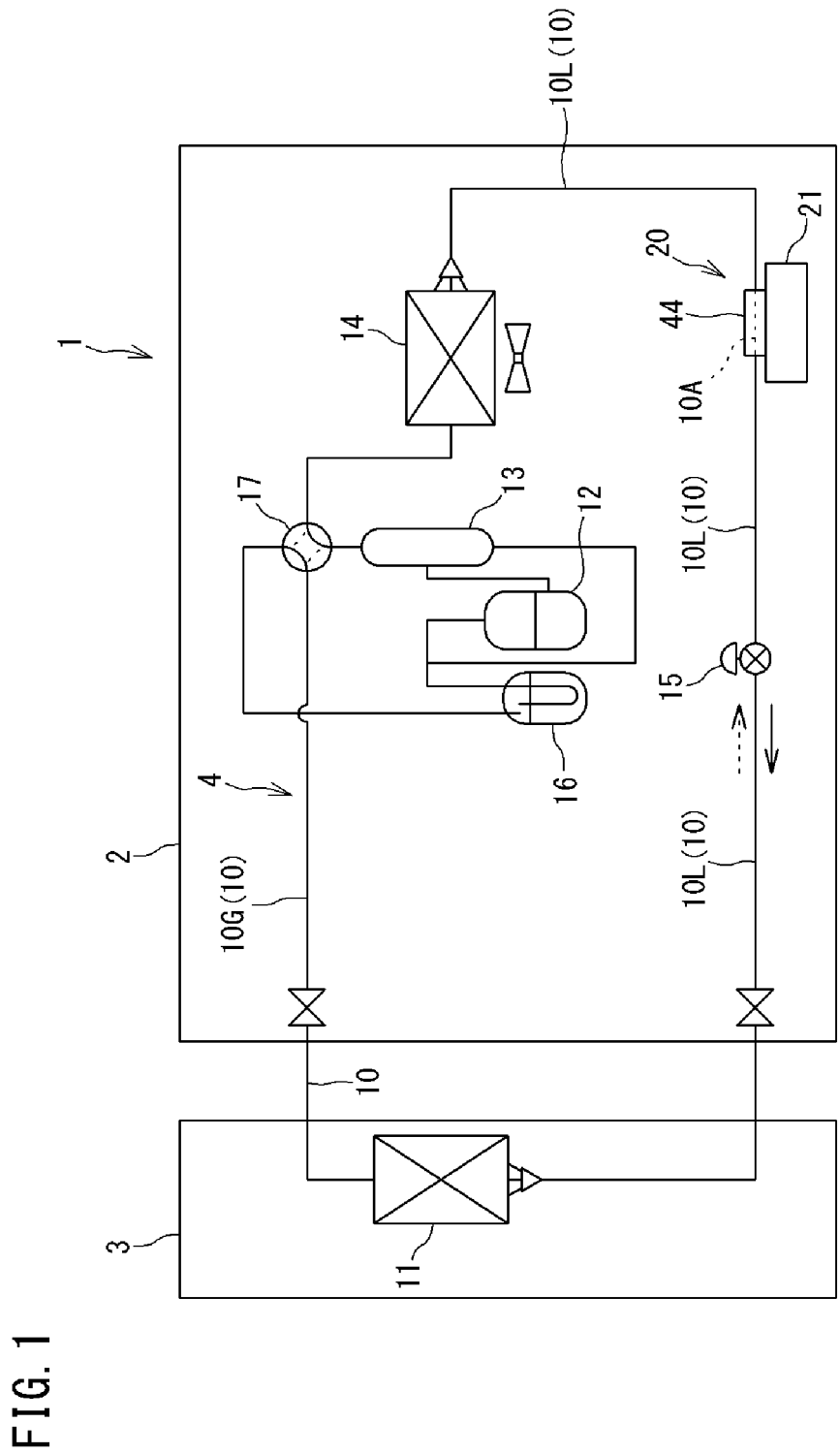
FIG. 1 is a schematic configuration diagram of an air conditioner according to one or more embodiments of the present invention.

FIG. 1 is a schematic configuration diagram of an air conditioner according to one or more embodiments of the present invention.

An air conditioner 1 serving as a refrigerating device includes an outdoor unit 2 installed outdoor, and an indoor unit 3 installed indoor. The outdoor unit 2 and the indoor unit 3 are connected to each other by communication pipes. The air conditioner 1 includes a refrigerant circuit 4 that performs a vapor compression refrigerating cycle. An indoor heat exchanger 11, a compressor 12, an oil separator 13, an outdoor heat exchanger 14, an expansion valve (expansion mechanism) 15, an accumulator 16, a four way valve 17, and the like are provided in the refrigerant circuit 4. These are connected by a refrigerant pipe 10 through which a refrigerant of the refrigerant circuit 4 flows. The refrigerant pipe 10 includes a liquid pipe 10L and a gas pipe 10G.

The indoor heat exchanger 11 is a heat exchanger for exchanging heat between the refrigerant and the indoor air, provided in the indoor unit 3. For example, a cross fin type fin-tube heat exchanger or the like can be adopted as the indoor heat exchanger 11. In the vicinity of the indoor heat exchanger 11, an indoor fan (not shown) for blowing the indoor air to the indoor heat exchanger 11 is provided.

The compressor 12, the oil separator 13, the outdoor heat exchanger 14, the expansion valve 15, the accumulator 16, and the four way valve 17 are provided in the outdoor unit 2.

The compressor 12 compresses the refrigerant suctioned from a suction port and discharge the refrigerant from a discharge port. Various compressors such as a scroll compressor can be adopted as the compressor 12.

The oil separator 13 separates lubricating oil from a mixture fluid of the lubricating oil and the refrigerant discharged from the compressor 12. The separated refrigerant is fed to the four way valve 17, and the lubricating oil is returned to the compressor 12.

The outdoor heat exchanger 14 exchanges heat between the refrigerant and the outdoor air. For example, a cross fin type fin-tube heat exchanger or the like can be adopted as the outdoor heat exchanger. In the vicinity of the outdoor heat exchanger 14, an outdoor fan for blowing the outdoor air to the outdoor heat exchanger 14 is provided.

The expansion valve 15 is arranged between the outdoor heat exchanger 14 and the indoor heat exchanger 11 in the refrigerant circuit 4. The expansion valve 15 expands the inflow refrigerant and decompress it to predetermined pressure. For example, an electronic expansion valve 15 in which an opening degree is variable can be adopted as the expansion valve 15.

The accumulator 16 separates the inflow refrigerant into a gas and a liquid, and is arranged between the suction port of the compressor 12 and the four way valve 17 in the refrigerant circuit 4. The gas refrigerant separated by the accumulator 16 is suctioned by the compressor 12.

The four way valve 17 can be switched between a first state shown by a solid line and a second state shown by a broken line in FIG. 1. When the air conditioner 1 performs a cooling operation, the four way valve 17 is switched into the first state. When the air conditioner performs a heating operation, the four way valve 17 is switched into the second state.

A portion 10A of the refrigerant pipe 10 of the refrigerant circuit 4 is attached to a power device 41 of an inverter apparatus 21 and a refrigerant jacket (cooling plate) 44 for cooling a reactor 27 to be described later, and forms a cooler 20. In one or more embodiments, in consideration of a cooling ability, the liquid side pipe among the refrigerant pipe 10 forms the cooler 20 as shown in FIG. 1. In one or more embodiments, the liquid side pipe forming the cooler 20 is the liquid side pipe between the outdoor heat exchanger 14 and the expansion valve 15 in the refrigerant circuit 4. However, the present invention is not limited to this.

Through the liquid side pipe forming the cooler 20, the refrigerant condensed in the outdoor heat exchanger 14 flows at the time of the cooling operation, and the refrigerant condensed in the indoor heat exchanger 11 and decompressed in the expansion valve 15 flows at the time of the heating operation. Temperatures of these refrigerants are different depending on an operation condition or the like, and, for example, about 40 to 45° C. at the time of the cooling operation.

Figure 2:
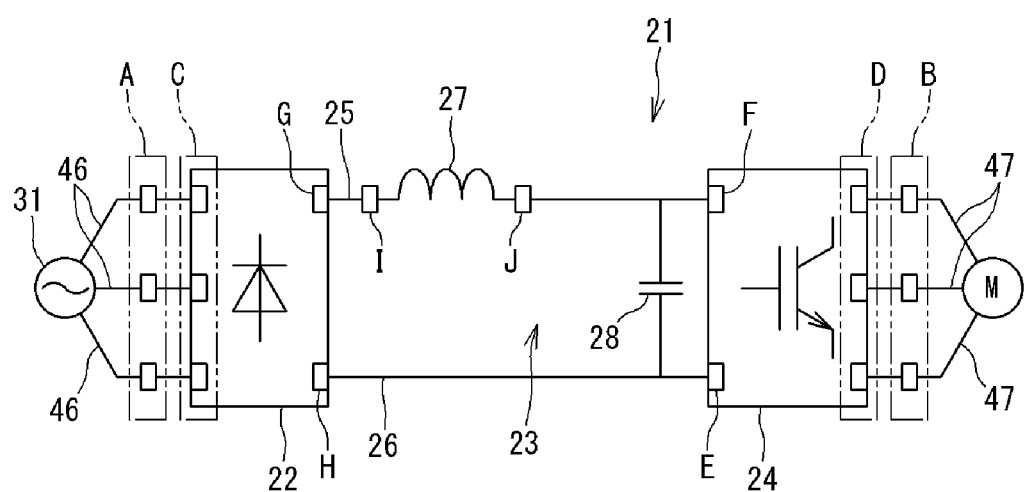
FIG. 2 is a schematic configuration diagram of an inverter apparatus used in the air conditioner according to one or more embodiments.

FIG. 2 is a schematic configuration diagram of the inverter apparatus.

This inverter apparatus 21 is used for variably controlling an operation frequency of a motor (electric motor) M that drives the compressor 12 or the fans in the air conditioner.

The inverter apparatus 21 includes a converter circuit (rectification circuit) 22, a filter circuit 23, and an inverter circuit 24. The converter circuit 22 and the inverter circuit 24 form the power device 41 to be described later (refer to FIG. 3).

The converter circuit 22 is connected to an AC power supply 31 and DC power supply wires 25, 26. The converter circuit 22 rectifies and converts AC voltage inputted from the AC power supply 31 into pulsating voltage, and outputs this to the DC power supply wires 25, 26. FIG. 2 shows a diode bridge as an example of the converter circuit 22. However, the present invention is not limited to this, and, for example, an AC-DC converter that converts AC voltage into DC voltage by synchronous rectification may be used. The AC power supply 31 may be a polyphase AC power supply or a monophase AC power supply.

The filter circuit 23 is connected to the converter circuit 22 via the DC power supply wires 25, 26. The filter circuit 23 includes the reactor 27 and a capacitor 28.

The reactor 27 is connected to the DC power supply wire 25. The reactor 27 suppresses harmonic superimposed on the DC voltage flowing through the DC power supply wire 25 mainly at the time of a normal action of the inverter circuit 24.

The capacitor 28 is connected between an output side electric path of the reactor 27 and the DC power supply wire 26. The capacitor 28 forms a LC filter together with the reactor 27. This LC filter can damp a current component of a frequency which is the same as a frequency of a carrier used for generation of a control signal of the inverter circuit 24, and also suppress the current component of the frequency which is the same as the frequency of the carrier from flowing out to the AC power supply 31.

The reactor 27 and the capacitor 28 in this example are used as the LC filter rather than forming a smoothing circuit. In this case, electrostatic capacitance of the capacitor 28 and inductance of the reactor 27 can be reduced, so that the capacitor 28 and the reactor 27 can be more downsized. By downsizing the reactor 27, a height difference between the power device 41 and the reactor can be decreased as described later (refer to FIG. 3), so that the reactor can be easily cooled by the cooler 20 together with the power device 41.

The inverter circuit 24 is connected to the output side of the filter circuit 23 via the DC power supply wires 25, 26. The inverter circuit 24 is formed by plural switching elements (not shown) such as IGBTs. By properly controlling conduction/non-conduction of the switching elements, the inverter circuit 24 converts the DC voltage inputted via the filter circuit 23 into AC voltage and applies the voltage onto the motor M. The plural switching elements of the inverter circuit 24 are controlled by a control unit (not shown).

Figure 3:
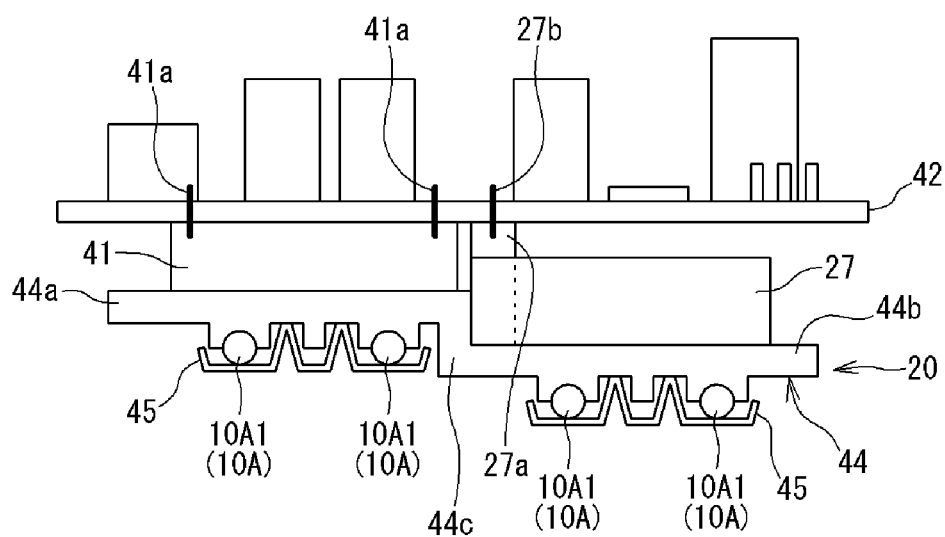
FIG. 3 is a side view of a printed wiring board, a power device, and a reactor according to one or more embodiments.
Figure 4:
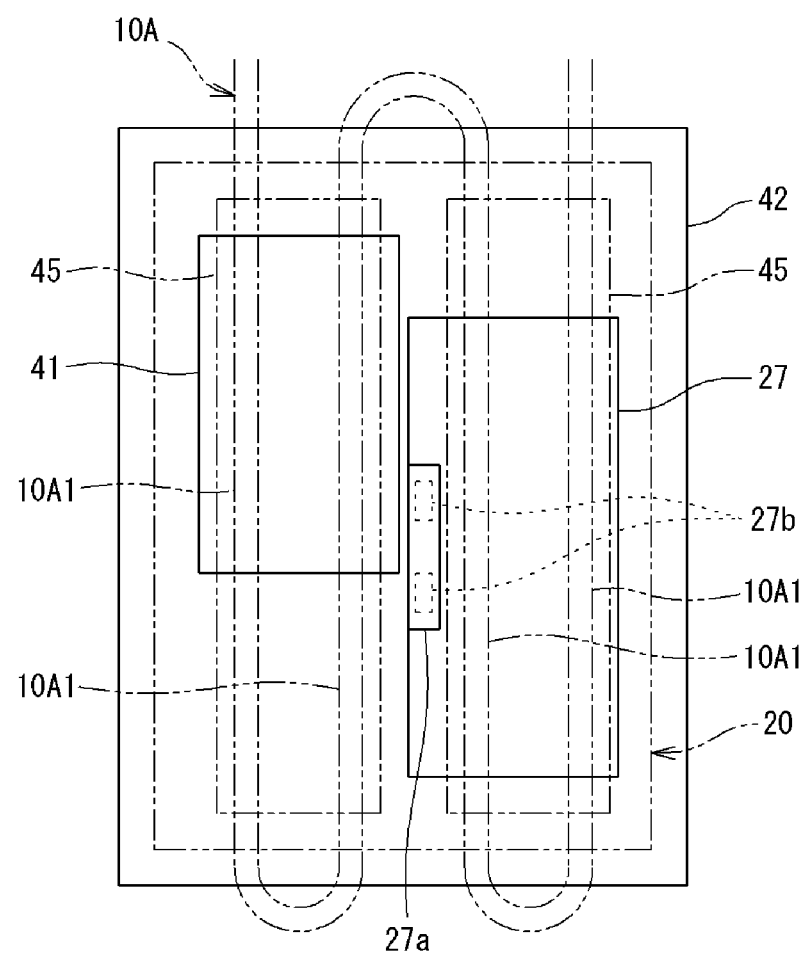
FIG. 4 is a back view of the printed wiring board, the power device, and the reactor according to one or more embodiments.

FIG. 3 is a side view of a printed wiring board 42, the power device 41, and the reactor 27 forming the inverter apparatus 21. FIG. 4 is a back view of the printed wiring board 42, the power device 41, and the reactor 27.

In the printed wiring board 42, wiring patterns made of a conductive body are formed on an insulating substrate of glass epoxy resin or the like formed into a rectangular shape in a plan view. Electric parts such as the capacitor 28, a resistor, a relay module, and a microcomputer are mounted on a main surface (upper surface) of the printed wiring board 42. Meanwhile, the power device 41 and the reactor 27 are arranged on a surface (back surface) opposite to the main surface of the printed wiring board 42. The power device 41 includes the converter circuit 22 and the inverter circuit 24 shown in FIG. 2. In the power device 41 of one or more embodiments, the converter circuit 22 and the inverter circuit 24 are housed in one case and modularized.

The power device 41 is formed into a cuboid whose planar shape is a rectangle, the cuboid having thickness which is less than length of each side of the rectangle. The reactor 27 is similarly formed into a cuboid whose planar shape is a rectangle, the cuboid having thickness which is less than length of each side of the rectangle. The power device 41 and the reactor 27 are arranged side by side on the back surface side of the printed wiring board 42. Both the power device 41 and the reactor 27 are arranged within a plane projection area of the printed wiring board 42 adjacently to each other. Therefore, in comparison to a case where these parts 41, 27 (the reactor 27 in particular) are arranged out of the plane projection area of the printed wiring board 42, the inverter apparatus 21 can be more downsized.

A large number of lead pins (connection terminals) 41a project in an outer peripheral portion of the power device 41. These lead pins 41a pass through the printed wiring board 42 in the up and down direction, and are connected to the wiring patterns of the printed wiring board 42.

The reactor 27 includes a terminal block 27a in one side portion, and connection terminals 27b are provided in this terminal block 27a. Coil electric wires built in the reactor 27 are connected to the connection terminals 27b. The terminal block 27a is made of a synthetic resin material which is an insulating body. The terminal block 27a is arranged between the reactor 27 and the power device 41.

The cooler 20 is arranged on lower surfaces of the power device 41 and the reactor 27 (surfaces opposite to the printed wiring board 42). This cooler 20 includes the cooling plate 44 and the refrigerant pipe 10A.

The cooling plate 44 is made of a material having high thermal conductivity such as aluminum. The cooling plate 44 is provided in a range to cover the entire planar range of the power device 41 and the reactor 27. The cooling plate 44 includes a portion 44a that covers the lower surface side of the power device 41, and a portion 44b that covers the lower surface side of the reactor 27, and a step portion 44c is formed between both the portions 44a, 44b. Thickness of both the portions 44a, 44b is substantially the same, and a thickness difference between the power device 41 and the reactor 27 is absorbed by the step portion 44c.

The portion 10A of the refrigerant pipe 10 is in contact with a lower surface of the cooling plate 44. For example, as shown in FIG. 4, this refrigerant pipe 10A is bent into a W shape to make two runs between one end portion of the cooling plate 44 and the other end portion. Since the refrigerant pipe 10 is bent into a W shape, substantially four straight pipe portions 10A1 of the refrigerant pipe 10A are arranged on the cooling plate 44, and two of the straight pipe portions 10A1 are arranged on the lower side of each of the power device 41 and the reactor 27.

As shown in FIG. 3, fixing plates 45 for fixing the refrigerant pipe 10A are provided in the cooling plate 44. Two fixing plates 45 are provided, and each of the fixing plates fixes two of the straight pipe portions 10A1. The refrigerant pipe 10A is fixed to the cooling plate 44 by being sandwiched between the cooling plate 44 and the fixing plates 45. The fixing plates 45 are attached to the cooling plate 44 by bolts and the like.

The power device 41 and the reactor 27 are parts that generate more heat than the other parts on the printed wiring board 42 (high heat generating parts). However, both the power device and the reactor are cooled by performing heat exchange with the refrigerant flowing through the refrigerant pipe 10A via the cooling plate 44. Both the power device 41 and the reactor 27 are arranged on the one surface (back surface) side of the printed wiring board 42, and can be arranged close to each other. Thus, the power device and the reactor can be cooled by using the same cooler 20. Therefore, a structure for cooling the power device 41 and the reactor 27 can be simplified.

The refrigerant pipe 10A is not limited to a W shape and may be bent into a U shape, for example. In this case, two straight pipe portions 10A1 of the U shaped refrigerant pipe 10A may be provided only in a portion 44a of the cooling plate 44 that covers the lower surface side of the power device 41. Even by only providing the straight pipe portions 10A1 in such a way, the reactor 27 can be sufficiently cooled.

Figure 5:
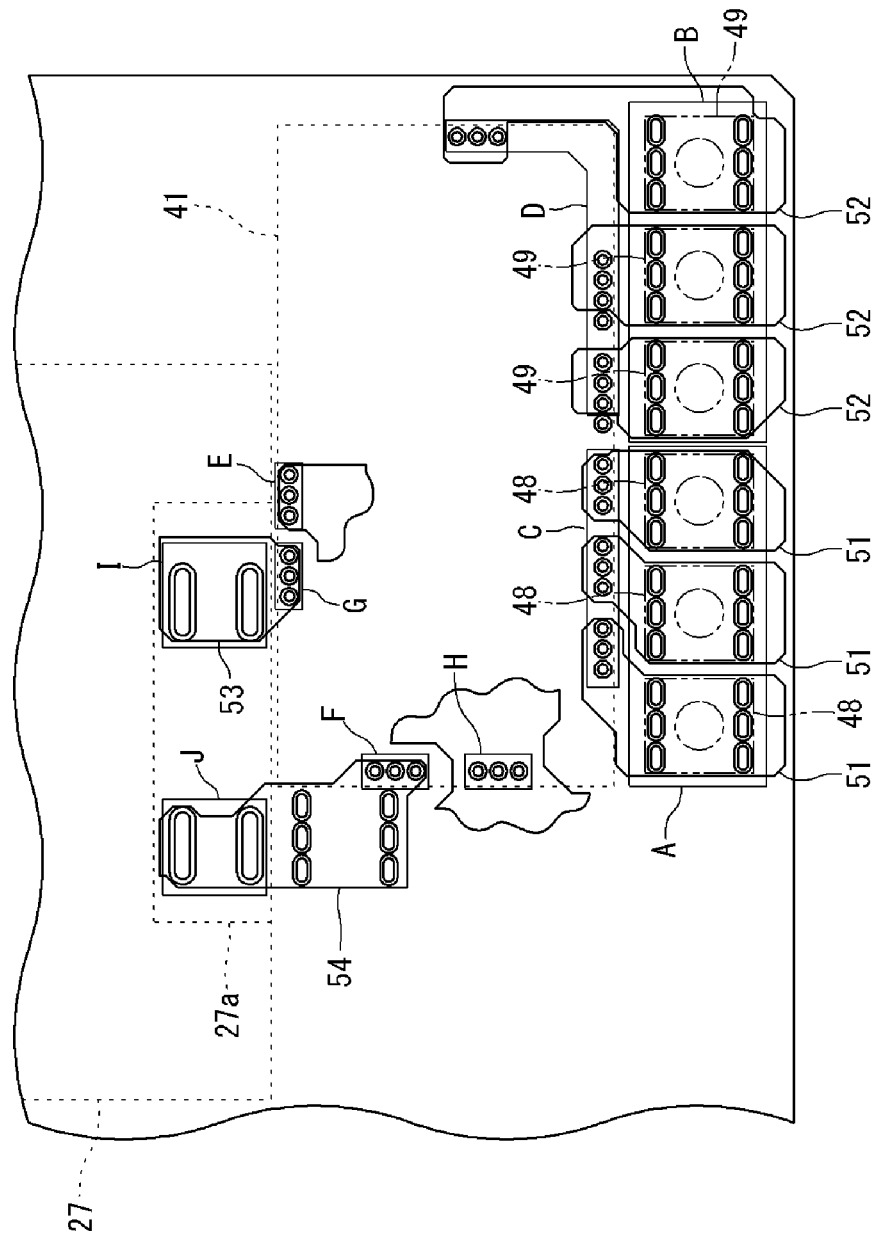
FIG. 5 is an illustrative plan view showing wiring patterns of the printed wiring board according to one or more embodiments.

FIG. 5 is an illustrative plan view showing the wiring patterns of the printed wiring board.

The printed wiring board 42 includes first connection portions C to H to which the power device 41 is connected, second connection portions I, J to which the reactor 27 is connected, third connection portions A to which a power supply wire 46 from the AC power supply 31 is connected, and fourth connection portions B to which an output wire 47 to the motor M is connected.

The first connection portions C to H are provided at plural points corresponding to the plural lead pins 41a which are provided corresponding to the outer peripheral portion of the power device 41.

The second connection portions I, J are provided at two points corresponding to two connection terminals 27b provided in the reactor 27.

The third connection portions A are provided at three points corresponding to phases of the three-phase AC power supply 31. Each of the third connection portions A includes a terminal block 48 for attaching a crimping terminal in a terminal of the power supply wire 46 (refer to FIG. 2) by screwing or the like.

The fourth connection portions B are provided at three points corresponding to output voltage of three phases outputted from the inverter circuit 24 of the power device 41. Each of the fourth connection portions B includes a terminal block 49 for attaching a crimping terminal in the output wire 47 connected to the motor M (refer to FIG. 2) by screwing or the like. The connection points of the third connection portions A and the fourth connection portions B are respectively provided in a place near the converter circuit 22 and the inverter circuit 24 in the power device 41. Thereby, the wiring patterns can be simplified.

The first connection portions C to H connected to the power device 41 are arranged between the third connection portions A connected to the power supply wire 46 and the fourth connection portions B connected to the output wire 47, and the second connection portions I, J connected to the reactor 27.

The third connection portions A and the first connection portions C among the first connection portions are connected by a wiring pattern 51 of the printed wiring board 42. The fourth connection portions B and the first connection portions D among the first connection portions are connected by a wiring pattern 52 of the printed wiring board 42. The second connection portion I among the second connection portions and the first connection portion G among the first connection portions are connected by a wiring pattern 53, and the second connection portion J and the first connection portion F are connected by a wiring pattern 54.

Therefore, an electric current flowing from the AC power supply 31 is inputted from the third connection portions A to the converter circuit 22 via the first connection portions C, then inputted from the converter circuit 22 to the reactor 27 via the first connection portion G and the second connection portion I, further inputted from the reactor 27 to the inverter circuit 24 via the second connection portion J and the first connection portion F, and outputted from the inverter circuit 24 to the motor M via the first connection portions D and the fourth connection portions B.

As described above, in the inverter apparatus 21, the electric current from the AC power supply 31 flows to the converter circuit 22, the reactor 27, and the inverter circuit 24 in this order, and is outputted to the motor M. Thus, by arranging the first connection portions C to H between the third and the fourth connection portions A, B and the second connection portions I, J as described above, the wiring patterns 51 to 54 in the printed wiring board 42 can be formed along a flow of the electric current, so that the wiring patterns 51 to 54 can be simplified.

The connection terminals 27b of the reactor 27 are directly connected to the wiring patterns 53, 54 of the printed wiring board 42. Therefore, there is no electric wire for letting an electric current flow between the both. Thus, an influence of noises provided to peripheral electric parts due to the electric wire can be reduced.

Figure 6A:
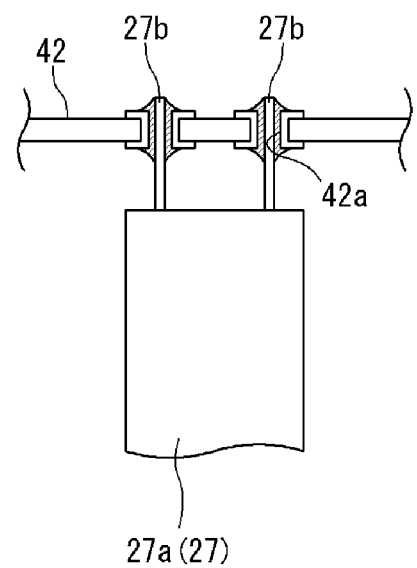
FIGS. 6A-6B are illustrative sectional views each showing an example of connection between connection terminals of the reactor and the printed wiring board according to one or more embodiments.
Figure 6B:
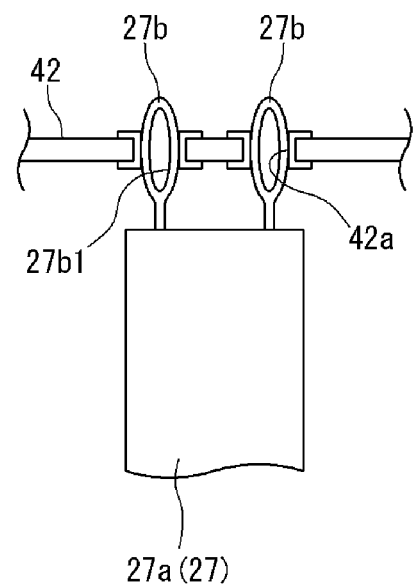

FIGS. 6A-6B are illustrative sectional views each showing an example of connection between the connection terminals 27b of the reactor 27 and the printed wiring board 42.

In an example shown in FIG. 6A, the connection terminals 27b of the reactor 27 are inserted into holes 42a formed in the printed wiring board 42 and are fixed by soldering.

In an example shown in FIG. 6B, the connection terminals 27b of the reactor 27 are formed by press-fit pins. Each of the press-fit pins 27b has a hollow portion 27b1 in an intermediate portion in the longitudinal direction. By inserting the press-fit pins 27b into the holes 42a of the printed wiring board 42, the press-fit pins 27b are compressed and deformed, so that the press-fit pins 27b are pressure-welded to inner peripheral surfaces of the holes 42a of the printed wiring board 42. Therefore, soldering is not required, and the reactor 27 can be extremely easily connected to the printed wiring board 42.

In addition to the connection examples shown in FIGS. 6A-6B, the connection terminals 27b may be fixed to the printed wiring board 42 by screwing or the like.

The entire reactor 27 of one or more embodiments described above is arranged within the plane projection area of the printed wiring board 42. However, part of the reactor may be arranged within the plane projection area of the printed wiring board 42.

Figure 7A:
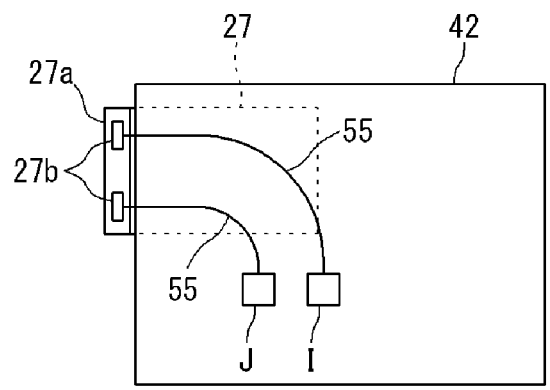
FIGS. 7A-7C are illustrative plan views each showing a modified example of arrangement of the printed wiring board and the reactor according to one or more embodiments.

For example, as shown in FIG. 7A, the terminal block 27a in which the connection terminals 27b are provided among the reactor 27 is arranged out of the plane projection area of the printed wiring board 42, and the other portions are arranged within the plane projection area. The connection terminals 27b of the reactor 27 are connected to the second connection portions I, J of the printed wiring board 42 via harnesses (electric wires) 55.

Figure 7B:
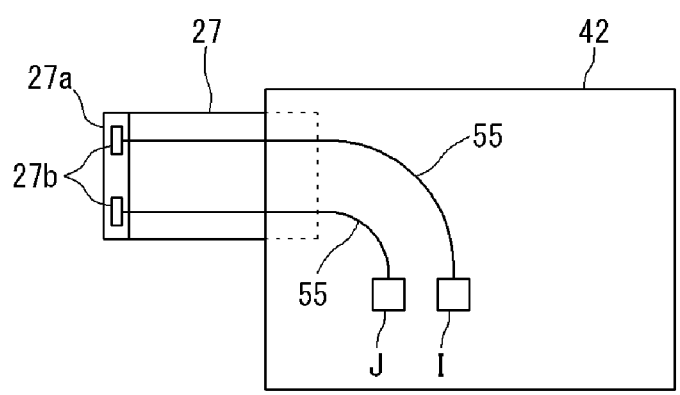

In an example shown in FIG. 7B, a half or more of the reactor 27 including the terminal block 27a is arranged out of the plane projection area of the printed wiring board 42. In a modified example shown in FIG. 7C, a half or more of the reactor 27 including the terminal block 27a is also arranged out of the plane projection area of the printed wiring board 42. However, the terminal block 27a is arranged in an end portion in the longitudinal direction of the reactor 27 in the example shown in FIG. 7B, whereas the terminal block 27a is arranged in an end portion in the short direction of the reactor 27 in the example shown in FIG. 7C and a distance between the terminal block 27a and the second connection portions I, J is shorter than the example shown in FIG. 7B. Therefore, the harnesses 55 connecting the terminal block 27a and the second connection portions I, J can be shortened.

Figure 7C:
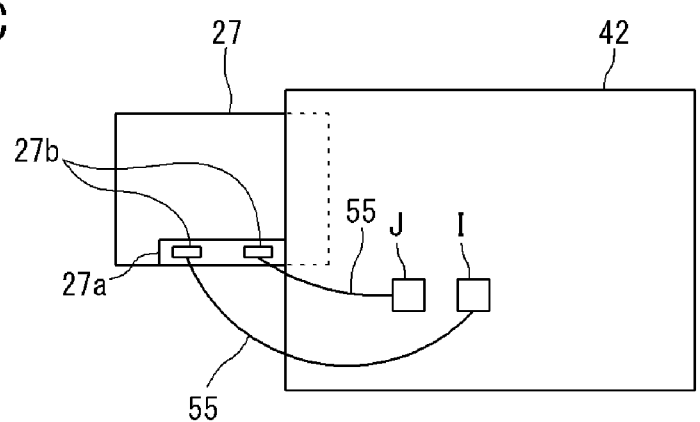

As described above, when the connection terminals 27b among the reactor 27 are arranged out of the plane projection area of the printed wiring board 42, the harnesses 55 for connecting to the second connection portions I, J can be connected outside the printed wiring board 42. Thus, there is an advantage that a connection task such as arrangement of the harnesses 55 can be easily performed. In addition, by arranging at least part of the reactor 27 within the plane projection area of the printed wiring board 42, the harnesses 55 connecting the connection terminals 27b of the reactor 27 and the printed wiring board 42 can be shortened. In addition, in a case where most of the reactor 27 is arranged out of the plane projection area of the printed wiring board 42, by bringing the connection terminals 27b closer to the printed wiring board 42 as shown in FIG. 7C, the harnesses 55 can be shortened as far as possible. There is a possibility that the harnesses 55 serve as noise propagation routes and provide the influence of noises on peripheral electric parts. Thus, by shortening the harnesses 55, the influence of noises can be reduced.

Figure 8:
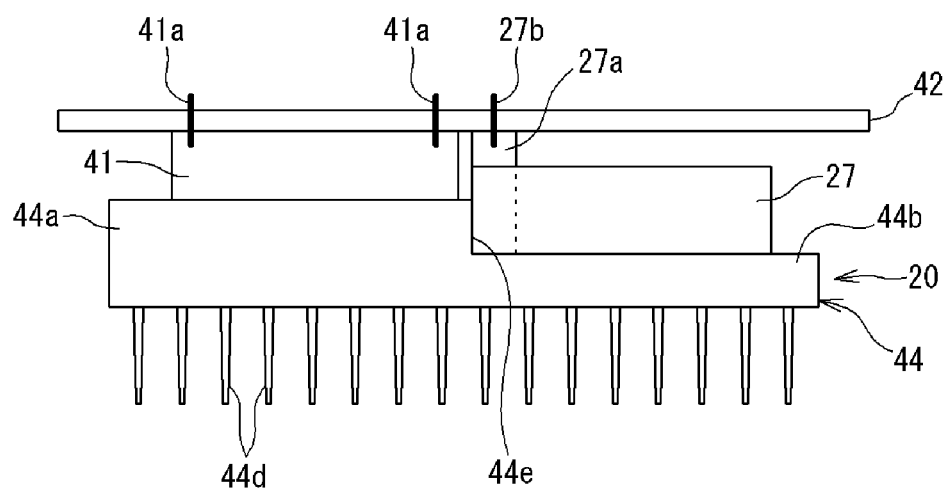
FIG. 8 is a side view showing a modified example of a cooler according to one or more embodiments.

FIG. 8 is a side view showing a modified example of the cooler 20.

The cooler 20 of one or more embodiments described above cools the power device 41 and the reactor 27 with the refrigerant flowing through the refrigerant pipe 10A. However, the cooler 20 shown in FIG. 8 cools the power device 41 and the reactor 27 with the air as a cooling medium. Plural fins 44d for increasing a contact area with the air are provided on a lower surface of the cooling plate 44 of this cooler 20.

In one or more embodiments, the lower surface of the cooling plate 44 in which the fins 44d are provided is a flat surface, and on an upper surface of the cooling plate 44, a step surface 44e is provided between the portion 44a that covers the power device 41 and the portion 44b that covers the reactor 27, and thickness is different between both the portions 44a, 44b. By this thickness difference between both the portions 44a, 44b, the thickness difference between the power device 41 and the reactor 27 is absorbed. Even in this modified example, the power device 41 and the reactor 27 can also favorably be cooled.

The present invention is not limited to the above embodiments and can be appropriately changed within the scope of the invention described in the claims.

For example, the cooler 20 cools both the power device 41 and the reactor 27 by one cooling plate 44 in the above description. However, the cooling plate 44 may be divided into two corresponding to the power device 41 and the reactor 27.

Even in a case where a reactor having much greater thickness than that of the power device 41 is used as the reactor 27, the case can be handled by using a cooling plate 44 with a much larger step portion 44c or step surface 44e or dividing the cooling plate 44 into two.

For example, one or more embodiments of the present invention can also be applied to an inverter apparatus including a smoothing circuit in which pulsating voltage outputted from the converter circuit 22 is smoothed in place of the filter circuit 23 as described above. In this case, a large reactor 27 having greater inductance than that of the reactor 27 of the filter circuit 23 is used. Even in such a case, the reactor 27 can also be cooled by the cooler 20 together with the power device 41.

In one or more embodiments shown in FIG. 2, as the cooling plate 44, a cooling plate having a structure in which the fins 44d are omitted from the cooling plate 44 shown in FIG. 8 may be used, or in the modified example shown in FIG. 8, a cooling plate having a structure in which fins are provided in the cooling plate 44 shown in FIG. 2 may be used.

The power device 41 is not limited to the power device in which the converter circuit 22 and the inverter circuit 24 are brought into an integrated module and may be a power device in which these circuits are formed as separate bodies.

In the inverter apparatus 21 of the above one or more embodiments, the printed wiring board 42, the power device 41 and the reactor 27, and the cooler 20 are arranged side by side in the up and down direction (laminated). However, the direction of arrangement of these is also not particularly limited. For example, the printed wiring board 42, the power device 41 and the reactor 27, and the cooler 20 may be arranged and laminated in the horizontal direction.

One or more embodiments of the present invention can also be applied to a refrigerating device other than the air conditioner 1 for indoor use.

REFERENCE SIGNS LIST

1: AIR CONDITIONER (REFRIGERATING DEVICE)
20: COOLER
21: INVERTER APPARATUS
22: CONVERTER CIRCUIT
23: FILTER CIRCUIT
24: INVERTER CIRCUIT
27: REACTOR
27b: CONNECTION TERMINAL
41: POWER DEVICE
42: PRINTED WIRING BOARD
46: POWER SUPPLY WIRE
47: OUTPUT WIRE
51 to 54: WIRING PATTERN
55: HARNESS (ELECTRIC WIRE)
A: THIRD CONNECTION PORTION
B: FOURTH CONNECTION PORTION
C to H: FIRST CONNECTION PORTION
I, J: SECOND CONNECTION PORTION
M: MOTOR (ELECTRIC MOTOR)

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. An inverter apparatus that variably controls an operation frequency of an electric motor provided in a refrigerating device, comprising:
 a printed wiring board;
 a power device directly attached to one surface of the printed wiring board, the power device including a converter circuit and an inverter circuit;
 a harmonic suppression reactor directly attached on a side of the one surface of the printed wiring board, at least a part of the reactor being arranged within a plane projection area of the printed wiring board; and
 a cooler for cooling the power device and the reactor, wherein
 the power device and the reactor are interposed between the cooler and the printed wiring board, and
 the power device and the reactor are in direct contact with the cooler.

2. The inverter apparatus according to claim 1, wherein the entire reactor is arranged within the plane projection area of the printed wiring board.

3. The inverter apparatus according to claim 1, wherein a connection terminal of the reactor is arranged within the plane projection area of the printed wiring board and directly connected to the printed wiring board.

4. An inverter apparatus that variably controls an operation frequency of an electric motor provided in a refrigerating device, comprising:
 a printed wiring board;
 a power device attached to one surface of the printed wiring board, the power device including a converter circuit and an inverter circuit;

a reactor arranged on a side of the one surface of the printed wiring board, at least a part of the reactor being arranged within a plane projection area of the printed wiring board; and a cooler for cooling the power device and the reactor, the cooler being arranged such that the power device and the reactor are interposed between the cooler and the printed wiring board, wherein the reactor is a harmonic suppression reactor provided between the converter circuit and the inverter circuit in an electric circuit, the printed wiring board includes a first connection portion to which the power device is connected, a second connection portion to which the reactor is connected, a third connection portion to which a power supply wire is connected, and a fourth connection portion to which an output wire to the electric motor is connected, and the first connection portion is arranged between the second connection portion, and the third connection portion and the fourth connection portion.

* * * * *